United States Patent [19]

Powell et al.

[11] Patent Number: 5,075,286

[45] Date of Patent: Dec. 24, 1991

[54] ALLOY METHOD OF MAKING A COMPOSITE HAVING SUPERCONDUCTING CAPABILITY

[75] Inventors: John C. Powell, Pittsburgh; Graham A. Whitlow, Murrysville, both of Pa.

[73] Assignee: Westinghouse Electric Corp., Pittsburgh, Pa.

[21] Appl. No.: 339,338

[22] Filed: Apr. 17, 1989

[51] Int. Cl.$^5$ ............................................. H01L 39/24
[52] U.S. Cl. ......................................... 505/1; 29/599; 228/158
[58] Field of Search ................. 29/599; 228/158, 186; 505/1, 705; 252/514

[56] References Cited

U.S. PATENT DOCUMENTS

| | | | |
|---|---|---|---|
| 2,416,400 | 2/1947 | Mehl | 228/158 X |
| 3,218,693 | 11/1965 | Allen et al. | 29/599 |
| 4,826,808 | 5/1989 | Yurek et al. | 427/62 X |
| 4,892,861 | 1/1990 | Ray | 252/514 X |

FOREIGN PATENT DOCUMENTS 2202528A 9/1988 United Kingdom .

OTHER PUBLICATIONS

Jin et al., *Applied Physics Letters*, vol. 51, No. 3, Jul. 20, 1987, pp. 203–204.
*Wall Street Journal*, Wessel & Stripp, Jun. 11, 1987.
*Metal Working News*, Hilsdorf, Aug. 17, 1987, p. 23.
*Science*, Robinson, vol. 236, No. 4808, Jun. 19, 1987, p. 236.
Haldar et al., *Applied Physics Letters*, vol. 51, No. 7, 1987, pp. 538–539.
Dragani, *Chem. & Engrg. News*, vol. 66, No. 49, Dec. 5, 1988, p. 5.
Pinkerton et al., *Applied Physics Letters*, vol. 53, No. 5, Aug. 1, 1988, pp. 438–440.

*Primary Examiner*—Joseph M. Gorski
*Attorney, Agent, or Firm*—Daniel P. Cillo

[57] ABSTRACT

A method of making a composite having superconducting capability is characterized by the steps: (1) forming a mixture of particulate yttrium or rare earth, that is alloyable with Ba and Cu, with particulate Ba, Cu, and Ag, where Ag additive is present in an amount of from 2 weight % to 30 weight % of the mixture, where the Ag additive has a particle size from 0.01 micrometer to 5 micrometers, (2) melting the mixture, (3) forming on a support surface a 10% to 30% porous ribbon of alloy having an interior Ag network, (4) removing the ribbon, (5) placing the ribbon alloy on top of a metal sheet, (6) placing a metal sheet on top of the ribbon alloy, (7) sealing the ribbon alloy within the metal sheets to form a composite, (8) uni-directional rolling the composite to reduce its cross-section, and (9) annealing the composite at from 100° C. to 900° C. in the presence of a source of oxygen, to provide a ceramic ribbon having contacting Ag additive particles effective to carry electrical current from the ceramic ribbon to the metal sheets at temperatures greater than 100° K.

11 Claims, 1 Drawing Sheet

ALLOY METHOD OF MAKING A COMPOSITE HAVING SUPERCONDUCTING CAPABILITY

BACKGROUND OF THE INVENTION

This invention relates to a method of making superconducting ribbon, by disposing a yttrium or rare earth metal-alkaline earth metal-copper-silver alloy ribbon between metal sheets, rolling the composite, and then oxidizing the metal mixture to form oxides.

Perovskite related ceramic oxides, comprising alkaline earth metal-copper oxide, such as orthorhombic, yttrium-barium-copper oxide materials, usually characterized as $YBa_2Cu_3O_{7-x}$ or "1:2:3 ceramic oxides", are well-known "high temperature" superconductor materials. This 1:2:3 ceramic oxide material has been found to provide electrical superconductivity, i.e., essentially no electrical resistance, at temperatures less than or in the region of 93° K.

The 1:2:3 ceramic oxides and other rare earth metal-alkaline earth metal-copper oxide based ceramics can operate in the superconducting mode near the 77° K. boiling point of relatively inexpensive and plentiful liquid nitrogen, and could find increased use in composite windings for high current magnets, energy storage coils, long distance power transmission, and the like. However, 1:2:3 ceramic oxide ribbons and other superconducting ceramic oxide ribbons generally made from sintered component oxide particles, are hard and brittle, and are not easily fabricated into fine wire or windings.

This brittleness was recognized by Jin et al., in *Applied Physics Letters*, "High $T_c$ Superconductors-Composite Wire Fabrication", Vol. 51, No. 3, Jul. 20, 1987, pp. 203-204. As a solution to this problem, Jin et al. placed a metal cladding around a heat treated 1:2:3 ceramic oxide powder superconducting core. The metal cladding, Ag, or Cu with a Ni/Au oxygen diffusion barrier, allowed ease of drawing into fine wire form, from 0.6 cm to 0.02 cm diameter, and also provided an alternate electrical conduction path in case the ceramic oxide lost its superconducting properties, i.e., became normal or resistive. Ag was found particularly advantageous as a cladding, since it could act as a dual cladding and oxygen donor. The drawn wires were then annealed at 900° C. and 600° C. in oxygen. Multifilamentary ribbon composites were also formed. Jin et al. also recognized the problem of oxygen loss from the metal clad 1:2:3 ceramic oxide, suggesting addition of an oxygen donor to the core, use of a perforated or porous cladding, and the like.

Attempts to solve problems with ceramic oxide superconductor brittleness have been reported by Wessel and Stipp in *The Wall Street Journal*, June 11, 1987; by Hilsdorf in *Metal Working News*, p. 23, Aug. 17, 1987; and by Robinson in *Science* "A New Route to Oxide Superconductors", Vol. 236, No. 4808, p. 236, June 19, 1987; all involving an apparent M.I.T. process of making a melt of europium, barium, copper, and possibly gold as reported by Hilsdorf, to form a metal alloy, and spinning the melt on a rotating wheel, to produce a very thin, solid ribbon made up solely of the alloy, followed by a controlled oxidation heat treatment in an oxygen environment to form a superconducting oxide ribbon.

A similar method of alloying Eu, Ba and Cu, solidification processing; and oxidizing to form the cuprate, is also reported by Haldar et al., in *Applied Physics Letters* "$EuBa_2Cu_3O_x$ Produced By Oxidation Of A Rapidly Solidified Precursor Alloy: An Alternative Preparation Method For High-$T_c$ Ceramic Superconductors", Vol. 51, No. 7, pp. 538-539 (1987). There, a $Eu_{.167}Ba_{.333}Cu_{.500}$ alloy was prepared by arc melting. The alloy was then quenched into 25 micrometer thick foil. The foil was heated at 900° C. in pure $O_2$ followed by cooling to 25° C. over 4 hours, to form the desired cuprate. Haldar et al. noted the apparent difficulty at that time of preparing rare earth (other than Eu or Yb) -$Ba_2Cu_3O_x$ superconductors by a metal-alloy route.

Forming a Y-Ba based 1:2:3 ceramic oxide by an alloy route was apparently solved by Vander Sande and Yurek, as reported by Dragani in *Chem. & Engrg. News*, Vol. 66, No. 49, p. 5 (Dec. 5, 1988), by forming a precursor alloy of yttrium, barium, and copper with a noble metal such as silver or gold, and heating in $O_2$ to form a 1:2:3 ceramic oxide, plus noble metal which is not oxidized. Yurek and Vander Sande suggest, in U.K. Patent Application GB 2,202,528A, published on Sept. 28, 1988, that a superconducting precursor mix of La, Ba and Cu; La, Sr and Cu; Y, Ba and Cu; or Eu, Ba and Cu, can have a metal selected from Au, Pt, Pd, Ag, or an excess of one of the metal constituents of the mix, added to and melted with the precursor composition. An alloy can be formed as a coating or as wire, ribbon, sheet, rod, or ring using chill casting or the like. The alloy can then be oxidized to convert the precursor elements to a superconducting oxide without oxidizing the metal additive. The metal additive (Au, Pt, Pd, Ag, etc.) is continuous throughout the ceramic and provides improved mechanical properties, such as ductility and strength, acting as a "skeleton" in the ceramic.

Others have formed 1:2:3 ceramic oxides by first melt spinning a $YCu_3$ alloy into a thin ribbon, then dip coating it with a molten mixture of $BaO_2$, $BaCO_3$ and $Ba(OH)_2$ at 550° C., followed by stepped heating in air to 925° C., as reported by Pinkerton et al. in *Applied Physics Letters*, "Superconducting Yttrium-Barium-Copper-Oxide Ribbons Fabricated From A Metal Alloy Precursor", Vol. 53, No. 5, pp. 438-440 (Aug. 1, 1988). The product, however, contained a small grained core of $Y_2BaCuO_5$ and $CuO_x$ within the $YBa_2Cu_3O_{7-x}$ superconducting structure.

What is needed is a method of optimizing the making of superconductor ribbons, where the ribbons have superior properties of deformability and oxygen permeability deep into the core. It is a main object of this invention to provide such a method.

SUMMARY OF THE INVENTION

Accordingly, the invention resides in a method of making a composite, containing ceramic oxides having superconducting capability disposed between and within two layers of metal sheet, characterized by the steps: (1) forming a mixture of: particulate metal selected from the group consisting of yttrium and rare earth metal, that is alloyable with Ba and Cu; particulate Ba; particulate Cu; and from 2 weight % to 30 weight %, based on the weight of the mixture, of particulate Ag additive, where the Ag has a particle size from 0.01 micrometer to 5 micrometers; (2) melting the mixture to form a homogeneous alloy with substantial contact of additive particles; (3) forming a thin, porous, deformable ribbon of the alloy from the homogeneous alloy melt, on a supporting surface, to provide 10% porous to 30% porous ribbon alloy having an interior, electrically conductive, oxygen permeable Ag network; (4) removing the ribbon from the support surface; (5) placing the ribbon alloy on top of a metal sheet; (6) placing a metal sheet on top of the ribbon alloy; (7) sealing the ribbon alloy within the metal sheets under a vacuum to form an evacuated composite; (8) rolling the composite to reduce its cross-section; and (g) annealing the rolled composite at a temperature of from 100° C. to 900° C. in the presence of a source of oxygen, to allow oxidation of the yttrium or rare earth metal, Ba, and Cu in the ribbon alloy, to form a ceramic oxide, and provide an electrically conductive, oxygen permeable Ag network within the ceramic oxide ribbon; and (10) cooling the composite to provide a mixed yttrium or rare earth, Ba, and Cu ceramic oxide core layer having interdispersed, substantially contacting additive particles effective to carry electrical current from the core layer to the metal sheets of the composite at temperatures greater than 100° K.

Elemental silver will preferably be used in the amount of from 5 weight % to 15 weight %. Silver oxides, such as $AgO_2$ or $Ag_2O_2$, can be disposed next to the top and/or bottom of the ribbon after step (4) prior to positioning between metal sheets. During annealing, such silver oxides can release oxygen to the interior silver network. Preferably, a rare earth metal, most preferably one of Eu and Yb will be added to Ba, Cu and Ag, and the rolling in step (8) will be uni-directional rolling. The term "rare earth" means elements 57 through 71. The term "ceramic oxides" means materials such as $EuBa_2Cu_3O_{7-x}$ or $YbBa_2Cu_3O_{7-x}$ or the like.

This method provides a simple, cost efficient means of producing highly rollable, windable ribbon or tape composite, provides an auxiliary, emergency, current carrying network within the basically metal-ceramic core ribbon, and reduces energy costs associated with high temperature annealing processes.

BRIEF DESCRIPTION OF THE DRAWINGS

In order that the invention will be more readily understood, the following description of preferred embodiments will now be described by way of example only, with reference to the accompanying drawings, in which.

DESCRIPTION OF THE PREFERRED EMBODIMENTS

The metal mixtures which are useful in the method of this invention are selected from alloyable mixtures of yttrium or rare earth metal-barium-copper-silver; preferably europium-barium-copper-silver, and ytterbium-barium-copper-silver. These mixtures consist essentially of elemental metals and do not contain metal oxides. While the description that follows is directed to the much preferred Eu and Yb, and their mixtures, the invention is not so limited and includes yttrium and preferably other rare earth elements that can be melt alloyed, or alloyed by any other means with Ba and Cu, and which when oxidized will, with the Ba and Cu provide superconducting properties.

Any suitable means can be taken to prevent oxidation of the metal particles. The metal particles can be purchased as essentially pure powder and maintained in an inert or reducing atmosphere. They may, if required be heated in a reducing atmosphere, such as hydrogen gas, prior to their being mixed with the other components to be used in the ribbon alloy. The mixing itself can also be carried out in an inert atmosphere, and melting to form the ribbon can be in a vacuum, an inert atmosphere or a reducing atmosphere. Upon annealing in oxygen or in contact with materials that release oxygen, the metal mixtures will produce mixed ceramic oxides effective to function as a superconductor. These oxides will preferably comprise silver doped $EuBa_2Cu_3O_{7-x}$ or silver doped $YbBa_2Cu_3O_{7-x}$.

Figure 1:
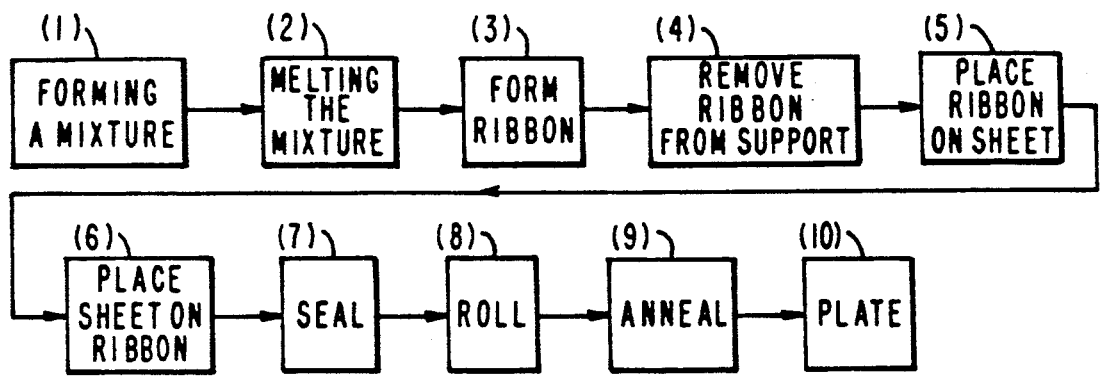
FIG. 1, which best illustrates the invention, is a block diagram which sets forth the steps of making a superconducting composite according to this invention.

FIG. 1 shows the method of this invention in block diagram form. In step (1), yttrium or rare earth metal, alloyable with Ba and Cu, preferably at least one of Eu and Yb, is mixed with Ba and Cu in stoichiometric amounts effective to form (yttrium or rare earth, preferably Eu or Yb)-$Ba_2Cu_3$ type materials, i.e., a 1:2:3 mole ratio of yttrium or rare earth: Ba:Cu. Particulate, elemental silver, Ag, is added as an additive from 2 weight % to 30 weight %, based on the total weight of the mixture, including Ag. Silver is a metal that is permeable to oxygen at high temperatures, as well as being highly electronically conductive. Silver addition is essential to this invention, since as much oxygen as possible is desired to be introduced within the core ribbon alloy layer during annealing step (9).

In some instances it may be desirable to add oxygen releasing particulate materials next to the core ribbon alloy, after the ribbon alloy has been formed. For example, $Ag_2O$, $Ag_2O_2$, and their mixtures, would release their oxygen during the annealing operation, and also contribute electronic conductivity. However, inclusion of these materials over 10 weight % per unit length, based on the weight of the ribbon alloy, would hinder the rollability and ductility of the core ribbon layer. The particle size of any of these additives, should not be larger than the original main metal components of the ribbon alloy.

The Ag additive will be present in the range of from 2 weight % to 30 weight %, preferably from 5 weight % to 15 weight %, in the particle size range of from 0.01 micrometer to 5 micrometers, preferably from 0.01 micrometer to 1.0 micrometer, and must be present to insure an effective, electrically conductive and oxygen permeable silver network within the superconducting ribbon to be formed. Such addition within the ranges specified is an essential requirement of the method of this invention. Preferably, all the particles, including Y, rare earth metal, Ba, Cu and additive will be in this particle size range. Particle sizes within the mentioned range provide a fine, substantially contacting, particulate network within the ribbon alloy in the small additive amounts listed. Gold, which is not oxygen permeable, cannot be substituted for silver.

In step (2), the mixture of step (1) is melted by any appropriate means, to form a homogeneous alloy with intimate contact of the additive particles. For example, an electric arc furnace operating at from 1,000° C. to 1,150° C. would be an effective melting means. In step (3), a thin, porous, deformable ribbon, containing the hereinbefore described metal mixture is formed on a supporting surface. The alloy melt can be allowed to flow out of the arc furnace onto a cooling support where the alloy will solidify to thin porous, removable ribbon form. The alloy melt can also be formed by ejecting it under pressure as a liquid, onto a rotating support wheel, where the solidified ribbon is spun off the wheel, as is well known in the art. This removal of the ribbon from the support is step (4). The porous, deformable ribbon will be from approximately 100 Angstroms to 20,000 Angstroms thick, and from approximately 10% porous to 30% porous (70% to 90% of theoretical density).

Since oxygen is absorbed into the metal lattice of the ribbon alloy during a step (9) annealing step, porosity of the ribbon alloy is very important to providing oxygen permeability into the ribbon alloy interstices, in order to provide a final, ceramic oxide material. Porosity less than 10% after step (3) will not allow sufficient oxygen channels to provide uniform transformation from strictly metal to metal-ceramic oxide form. Porosity over 30% will provide too many gaps between final ceramic oxide portions of the core, and diminish superconducting activity, and also diminish the effectiveness of the silver network. The silver network, as pointed out earlier, helps distribute oxygen, and is essential in allowing low porosity ribbon alloys that can absorb enough oxygen to convert to the ceramic superconducting phase.

The metal sheet used for receiving the ribbon alloys core in step (5), and used as a covering for the ribbon alloy core in step (6), can be oxygen permeable at high temperatures, including metals such as Ag; or oxygen impermeable at high temperatures, including metals such as Cu with an inner plating or strip of Ni, Au, or their mixture. In the case of oxygen permeable ribbon enclosing the core layer, no oxygen releasing silver oxide, as described previously, materials would be required next to the ribbon alloy. If an oxygen impermeable sheath is utilized, up to 10 weight % inclusion of silver oxides next to the ribbon alloy may be necessary.

In step (7) of the method, shown in FIG. 1, the ribbon alloy core layer is sealed within the top and bottom metal sheets under a vacuum, to form an evacuated composite. Here, the ends of the metal sheets can be hot press crimped together, welded together, or otherwise sealed by any suitable means to enclose or encapsulate the ribbon alloy core layer. The absence of an atmosphere will allow intimate core-sheet contact during subsequent rolling to reduce cross-section.

In step (8) the sealed, evacuated composite is cold rolled or hot rolled to reduce its cross-section as is well known in the art. Prior to step (8) the cross-section of the evacuated composite would vary from approximately 0.5 cm to 1.0 cm. Reduction could be in a thickness ratio of approximately 10:1 to 25:1, so that an initial 1.0 cm thick composite could be rolled to about 0.04 cm thick. The initial composite can be rolled one or more times to achieve a desired final cross-section. Hot and cold rolling is well known and any temperatures, pressures, and feed rates can be used to accomplish appropriate cross-section reductions.

The rolling process will preferably involve uni-directional rolling. Uni-directional rolling produces superconductors having a higher degree of preferred orientation within the core. There appears to be better alignment of the basal plane of the ceramic oxide unit cell, the plane in which superconducting properties are at an optimum. Uni-directional rolling has distinct advantages over drawing or extrusion processes used to produce wires in terms of reducing composite tension, improving bonding between the core and its encapsulating metal, and reducing cracking of the core.

In step (9), the rolled composite is annealed, i.e., heated and gradually cooled, in an $O_2$ atmosphere, such as air, but preferably pure $O_2$ at a temperature from 100° C. to 900° C., preferably from 250° C. to 400° C.. This allows oxidation of the metal in the core layer and provides a mixed ceramic oxide core layer effective to function as a superconductor. In the case where oxygen permeable metal sheets are used, $O_2$ will gradually permeate the sheets and the porous metal mixture of the core ribbon layer. In the case where oxygen impermeable metal sheets are used, oxygen releasing silver oxide particles disposed next to the ribbon alloy will release $O_2$ at the ribbon surface which can permeate the porous metal mixture of the core layer, all as described previously herein.

Figure 2:
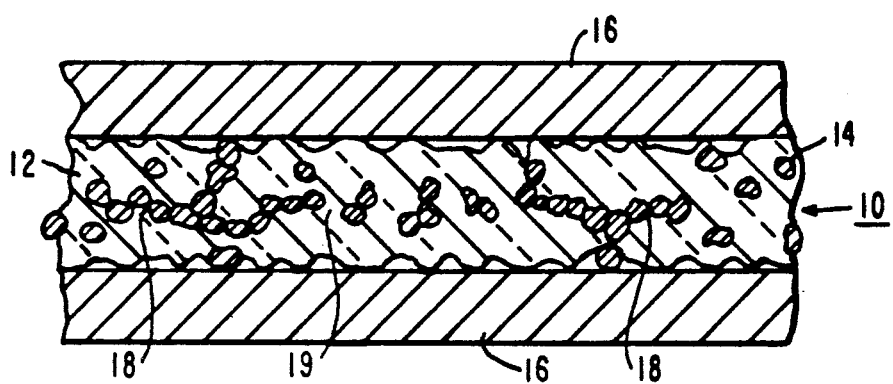
FIG. 2, shows a cross-sectional view of a plural layered superconducting composite structure having a conductive, interior Ag network, made by the method of this invention.

The composite after step (9) is shown in FIG. 2, where the core ribbon alloy layer 10 comprises a porous metal mixture 12, such as (Eu or Yb) $Ba_2Cu_3O_{7-x}$, also containing, unoxidized Ag metal particles 14. During annealing in $O_2$, the core layer would receive sufficient $O_2$ through the oxygen permeable top and bottom metal sheets 16 (sheath material), such as Ag ribbons. During annealing, the oxygen permeable Ag particles 14 would help $O_2$ permeate deeply into the core layer 10. As shown, with the small particle sizes described, and homogeneous mixing, a substantially contacting network 18 of Ag particles will be formed, part of which will be continuous. At some points, as at 19 there may be gaps, but the overall effect will be to provide electrical conductivity. Such a electrically conductive network is essential if temperatures during operation exceed 100° K. and the ceramic portion of the core ceases superconductivity. As can be seen in FIG. 2, several networks 18 are available to carry or channel electrical current from the center of the core layer 10 to the metal sheet sheathing 16 in case of a dramatic increase in temperature over about 100° K. during operation of the superconductor.

In the case of an oxygen impermeable sheet enclosing the core layer, oxygen releasing materials could be disposed next to the ribbon alloy, between it and within the metal sheets. Upon annealing in step (9), $O_2$ from the oxygen releasing particles near the ribbon alloy layer, would provide a source of $O_2$, to provide transition from an alloy to a ceramic oxide. The amount of oxygen releasing particles used would be an amount effective to provide such a transition from metal alloy to a ceramic oxide. The precipitated Ag metal from the oxygen releasing particles would contribute to electronic conductivity of the ribbon alloy core. The use of silver oxides has the advantage of trapping $O_2$, but requires precise addition of sufficient oxide to provide adequate $O_2$. While the silver oxides are not shown in FIG. 2, they would be disposed between the ribbon alloy layer 10 and one or both sheets 16.

As a final step (10), especially where oxygen permeable metal sheets are used, a thin Ni coating can be plated onto the outside of the rolled composite. These thin, superconducting composites, all having preferred orientation within their ceramic oxide core can be bundled together in units of from 20 to 100 and inserted within a standard tubular sheath and further deformed if desired, to form superconducting wires or filaments having superior superconducting properties.

A typical preferred Example to provide a superconducting composite would consist of the following steps: measuring out one gram mole of unoxidized Eu or Yb metal, two gram moles of unoxidized Ba metal and 3 gram moles of unoxidized Cu metal, and homogeneously mixing them under a blanket of a non-oxidizing gas such as $N_2$ with 15 weight % of Ag particles, where all the particles have an average diameter of about 0.5 micrometer. The mixture could then be placed in an arc furnace and melted at 1,100° C. under a blanket of a non-oxidizing gas such as $N_2$ and ejected under pressure onto a rotating wheel to cool, consolidate, and spin off a porous, metallic mixture of (Eu or Yb)-$Ba_2$-$Cu_3$-Ag of handleable integrity.

This ribbon would quickly be placed on a thin Ag sheet, covered by another thin Ag sheet, and sealed under a vacuum by welding the sides and ends of the Ag sheet together. The cross-section of the evacuated composite would be from approximately 0.5 cm to 1.0 cm thick. The composite would then be uni-directionally cold rolled several times to reduce the composite to approximately 1/25 of its original thickness. Then, the rolled composite, having $O_2$ permeable Ag walls, would be annealed in $O_2$ at from about 350° C., to allow the metal ribbon core mixture to adsorb $O_2$ into the lattice structure and form a mixed ceramic oxide core layer within the rolled composite having contacting Ag particles forming an electrically conductive network.

We claim:

1. A method of making a plural layered structure comprising silver-containing ceramic oxides having superconducting capability disposed between and within two layers of metal sheet, characterized by the steps of:
   (1) forming a homogeneous mixture of:
      (a) particulate, elemental metal selected from the group consisting of yttrium and rare earth metal, that is alloyable with Ba and Cu;
      (b) particulate, elemental Ba;
      (c) particulate, elemental Cu; and
      (d) from 2 weight % to 30 weight % of particulate, elemental Ag additive, where all the particulates have a particle size from 0.01 micrometer to 5 micrometers;
   (2) melting the mixture without oxidation, thereby forming a homogeneous alloy;
   (3) forming a thin, porous, deformable ribbon of the alloy from the alloy melt, on a supporting surface, in a manner such that the ribbon is 10% porous to 30% porous;
   (4) removing the porous ribbon from the supporting surface;
   (5) placing at least one of oxygen releasing $AgO_2$ and $Ag_2O_2$ particles, having a particle size no larger than that of the particulate metal of step (1), next to at least one surface of the already formed porous ribbon in an amount up to 10 weight % per unit length based on the weight of the ribbon, and placing the porous ribbon plus oxygen releasing particles between two metal sheets;
   (6) sealing the porous ribbon plus oxygen releasing particles within the metal sheets under a vacuum, thereby forming an evacuated plural layered structure;
   (7) uni-directionally rolling the structure, thereby reducing its cross-section;
   (8) annealing the rolled structure at a temperature of from 100° C. to 900° C. in the presence of a source of oxygen, thereby providing an interior electrically conductive, oxygen permeable elemental Ag network within the ribbon; to provide oxygen from the oxygen releasing particles added in step (5); and to allow oxidation of the yttrium or rare earth metal, Ba, and Cu in the ribbon, to form a ceramic oxide;
   (9) cooling the structure, thereby providing a mixed yttrium or rare earth, Ba, and Cu ceramic oxide core layer having an interior network of fine, interdispersed, substantially contacting, elemental Ag additive effective to carry electrical current from the core layer to the metal sheets of the plural layered structure at temperature greater than 100° K.

2. The method of claim 1, where the metal in step (1)(a) is a rare earth metal.

3. The method of claim 1, where the metal in step (1)(a) is Eu.

4. The method of claim 1, where the metal added in step (1)(a) is Yb.

5. The method of claim 1, where the metal in step (1)(a) is Y.

6. The method of claim 1, where the metal in step (1)(a) is a mixture of Eu and Yb.

7. The method of claim 1, where the metal sheets are oxygen permeable at high temperatures.

8. The method of claim 1, where the Ag additive of in step (1) is present in an amount from 5 weight % to 15 weight % of the mixture.

9. The method of claim 1, where the molar ratio of particulate step (1)(a) material: Ba:Cu is about 1:2:3.

10. The method of claim 1, including performing the melting at from 1,000° C. to 1,150° C., performing the annealing at from 250° C. to 400° C.

11. The method of claim 1, where the oxygen releasing particles, during the annealing step, precipitate Ag metal which contributes to the electronic conductivity of the ribbon alloy core, the metal sheets are Ag sheets, and the metal added in step 1 is yttrium.

* * * * *